(12) United States Patent
Lee et al.

(10) Patent No.: US 7,030,594 B2
(45) Date of Patent: Apr. 18, 2006

(54) PULSE WIDTH MODULATOR AND LOADING SYSTEM THEREOF

(75) Inventors: Joshru Lee, Taipei County (TW); Andre Yu, Taipei (TW)

(73) Assignee: Beyond Innovation Technology Co., Ltd., Taipei (TW)

( * ) Notice: Subject to any disclaimer, the term of this patent is extended or adjusted under 35 U.S.C. 154(b) by 158 days.

(21) Appl. No.: 10/707,685

(22) Filed: Jan. 5, 2004

(65) Prior Publication Data

US 2005/0104570 A1 May 19, 2005

(30) Foreign Application Priority Data

Nov. 14, 2003 (TW) .............................. 92131928 A

(51) Int. Cl.
*G05F 1/40* (2006.01)

(52) U.S. Cl. ..................................... 323/266
(58) Field of Classification Search ................ 323/266, 323/268, 270, 271, 273, 275, 281, 282, 285, 323/288; 332/109, 110, 115; 327/172, 175
See application file for complete search history.

(56) References Cited

U.S. PATENT DOCUMENTS

| 4,531,096 | A | * | 7/1985 | Yokoyama | 330/10 |
| 5,637,971 | A | * | 6/1997 | Pratt | 318/599 |
| 5,691,628 | A | * | 11/1997 | Martin | 323/237 |
| 5,703,473 | A | * | 12/1997 | Phillips et al. | 323/282 |
| 5,793,628 | A | * | 8/1998 | Koch | 363/152 |
| 6,636,124 | B1 | * | 10/2003 | Liu | 332/109 |

* cited by examiner

*Primary Examiner*—Matthew V. Nguyen
(74) *Attorney, Agent, or Firm*—Jianq Chyun IP Office

(57) ABSTRACT

A pulse width modulator and a loading system thereof are disclosed. The pulse width modulator comprises an amplitude-adjustable triangle-wave generator, an error signal generator and a pulse signal generator. The triangle-wave generator is adapted to perform an amplitude operation according to the reference voltage and the feedback voltage for generating an amplitude-adjustable triangle wave according to a variation of the feedback voltage. The error signal generator is adapted to perform an error operation according to the feedback voltage and the reference voltage for outputting an error signal. The pulse signal generator is adapted to receive and compare the error signal and the amplitude-adjustable triangle wave for outputting a pulse controlling signal for the loading system.

29 Claims, 8 Drawing Sheets

PULSE WIDTH MODULATOR AND LOADING SYSTEM THEREOF

CROSS REFERENCE TO RELATED APPLICATIONS

This application claims the priority benefit of Taiwan application Ser. No. 92131928, filed Nov. 14, 2003.

BACKGROUND OF INVENTION

1. Field of the Invention

The present invention relates to a pulse width modulator, and more particularly to a pulse width modulator having an amplitude-adjustable triangle-wave generator for modifying the amplitude of the triangle wave, changing the width of the controlling signal and enhancing the transient response of the loading system.

2. Description of the Related Art

Pulse width modulation (PWM) is a traditional method for controlling the feedback circuit, such as the boosting circuit, the buck circuit, the push-pull circuit, half-bridge circuit or full-bridge circuit. In the prior art technology, error amplifiers and triangular-wave generators for generating fixed-amplitude triangle wave as to generate a pulse according to the error variations.

FIG. 5 is a block circuit diagram showing a conventional pulse width modulator of a loading system. The loading system 50 comprises: a pulse width modulator 500, a switch 550 and a loading circuit 560. The switch 550 is coupled to a power terminal, the pulse width modulator 500 and a ground terminal. The input terminal 562 of the loading circuit 560 is coupled to the power terminal. The output terminal 564 of the loading circuit 560 is coupled to the ground terminal. The pulse width modulator 500 is coupled to the output terminal 564 of the loading circuit 560.

The pulse width modulator 500 comprises: a triangle-wave generator 510, an error amplifier 520, a comparator 530 and a driving circuit 540. A negative terminal of the error amplifier 520 is coupled to the output terminal 564 of the loading circuit 560 for receiving the feedback voltage therefrom. The positive terminal of the error amplifier 520 is coupled to a source of reference voltage. The positive terminal of the comparator 530 is coupled to the error amplifier 520, the negative terminal of the comparator 530 is coupled to the triangle-wave generator 510, and the output terminal of the comparator 530 is coupled to the driving circuit 540. FIG. 6 is a schematic drawing showing a conventional triangle-wave generator outputting the triangle wave, the error signal and the pulse controlling signal. The error amplifier 520 performs an error operation of the feedback voltage and the reference voltage for outputting an error signal 604 to the comparator 530. After the pulse width modulator 500 is turned on, the triangle-wave generator 510 outputs a fixed-amplitude triangle wave 602 to the comparator 530. The comparator 530 compares the error signal 604 and the fixed-amplitude triangle wave 602 for outputting the driving signal. Finally, the driving circuit 540 outputs a pulse controlling signal 606.

In the prior art loading system 50, the switch 550 controls the power terminal according to the pulse controlling signal from the comparator 530. When the switch 550 is turned on, the power is not transmitted to the loading circuit 560; if not, the power is transmitted to the loading circuit 560.

Accordingly, the conventional pulse width modulator have the following disadvantages: (1) In the conventional pulse width modulator, because the width of the pulse controlling signal is modulated by the error of the feedback voltage and the reference voltage, noises in the feedback voltage will interfere the width of the pulse controlling signal. (2) The conventional pulse width modulator generates a desired transient response for the loading system, but degrade the stability thereof. (3) The conventional pulse width modulator generates a desired stability of the loading system, but degrades the transient response thereof.

SUMMARY OF INVENTION

Therefore, an object of the present invention is to provide a pulse width modulator and a loading system thereof, which are adapted to perform an operation according to the reference voltage and the feedback voltage for generating an amplitude-adjustable triangle wave according to a variation of the feedback voltage.

Another object of the present invention is to provide a pulse width modulator and a loading system thereof, which are adapted to use the amplitude-adjustable triangle wave from the pulse width modulator for maintaining a desired transient response.

The present invention provides a pulse width modulator, adapted to receive a feedback voltage and a reference voltage. The pulse width modulator comprises a triangle-wave generator, an error signal generator, a pulse signal generator and a driving circuit. The amplitude-adjustable triangle-wave generator is adapted to perform an amplitude operation according to the reference voltage and the feedback voltage for generating an amplitude-adjustable triangle wave according to a variation of the feedback voltage. The error signal generator is adapted to perform an error operation according to the feedback voltage and the reference voltage for outputting an error signal. The pulse signal generator is coupled to the amplitude-adjustable triangle-wave generator and the error signal generator and adapted to receive and compare the error signal and the amplitude-adjustable triangle wave for outputting a pulse controlling signal. The driving circuit is coupled to the pulse signal generator and adapted to receive and transform the pulse generating signal for outputting a driving signal.

According to the preferred embodiment of the present invention, the amplitude-adjustable triangle-wave generator determines the amplitude of the triangle wave according to the difference between the feedback voltage and the reference voltage. When a difference between the feedback voltage and the reference voltage is higher than a transient voltage, the amplitude-adjustable triangle-wave generator outputs first amplitude of the amplitude-adjustable triangle wave. When a difference between the feedback voltage and the reference voltage is lower than a transient voltage, the amplitude-adjustable triangle-wave generator outputs a progressive second amplitude of the amplitude-adjustable triangle wave. When the feedback voltage is higher than, or equal to, the reference voltage, the amplitude-adjustable triangle-wave generator outputs a third amplitude of the amplitude-adjustable triangle wave.

According to the preferred embodiment of the present invention, the pulse width modulator can be applied to a loading system comprising: a front-end circuit, a fly-back circuit, a boosting circuit, a buck circuit, a push-pull circuit, a half-bridge circuit, or a full-bridge circuit.

Because the present invention uses the amplitude-adjustable triangle-wave generator for generating the amplitude-adjustable triangle wave according to the feedback voltage and the reference voltage, the loading system reaches the stable state soon and has high stability.

In order to make the aforementioned and other objects, features and advantages of the present invention understandable, preferred embodiments accompanied with figures are described in detail below.

DETAILED DESCRIPTION

Figure 1:
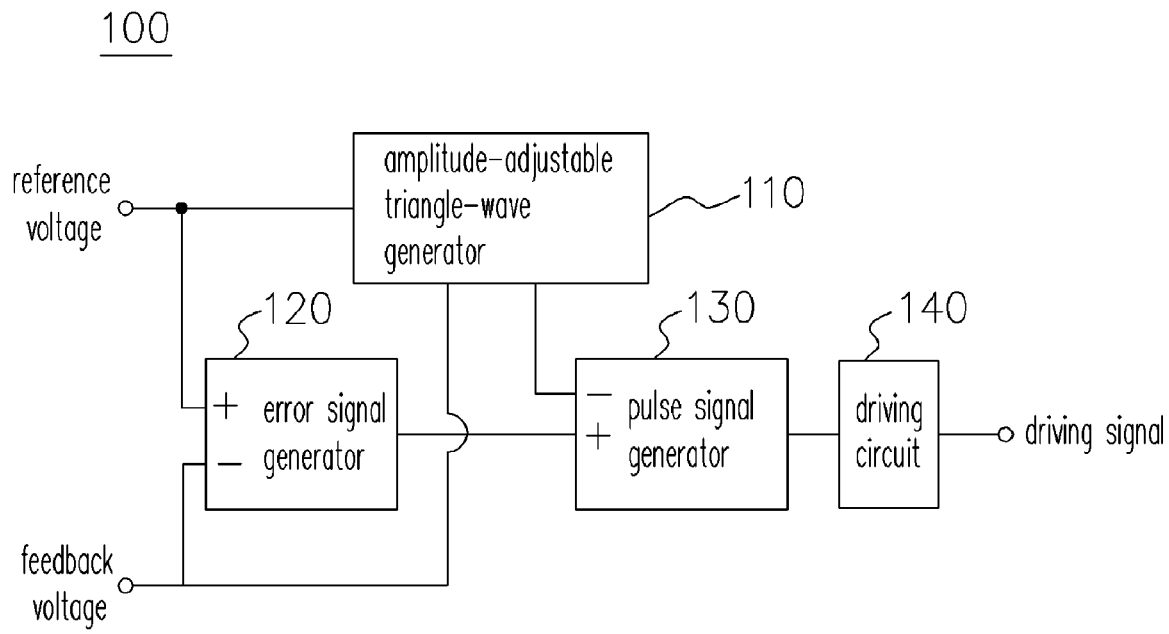
FIG. 1 is a block circuit diagram showing a pulse width modulator according to a preferred embodiment of the present invention.

FIG. 1 is a block circuit diagram showing a pulse width modulator according to preferred embodiment of the present invention. Referring to FIG. 1, the pulse width modulator 100 is adapted to receive a feedback voltage and a reference voltage. The pulse width modulator 100 comprises: an amplitude-adjustable triangle-wave generator 110, an error signal generator 120 and a pulse signal generator 130. The amplitude-adjustable triangle-wave generator 110 and the error signal generator 120 perform operations for the feedback voltage and the reference voltage. The pulse signal generator 130 is coupled to the amplitude-adjustable triangle-wave generator 110 and the error signal generator 120.

In the embodiment, the amplitude-adjustable triangle-wave generator 110 is adapted to perform an amplitude operation according to the reference voltage and the feedback voltage for generating an amplitude-adjustable triangle wave according to a variation of the feedback voltage. The error signal generator 120 is adapted to perform an error operation according to the feedback voltage and the reference voltage for outputting an error signal. The pulse signal generator 130 is adapted to receive and compare the error signal and the amplitude-adjustable triangle wave for outputting a pulse controlling signal as to control the switch of the loading system.

Figure 2A:
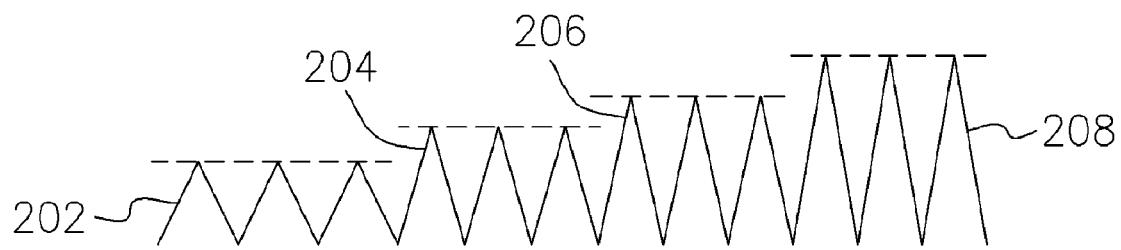
FIG. 2A is schematic drawings showing the discrete amplitude-adjustable triangle wave from the amplitude-adjustable triangle-wave generator according to the first embodiment of the present invention.
Figure 2B:
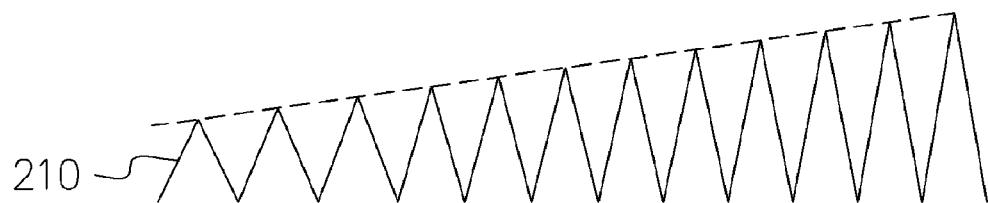
FIG. 2B is schematic drawings showing the continuous amplitude-adjustable triangle wave from the amplitude-adjustable triangle-wave generator according to the first embodiment of the present invention.

FIG. 2A is schematic drawings showing the discrete amplitude-adjustable triangle wave from the amplitude-adjustable triangle-wave generator of the first embodiment of the present invention. FIG. 2B is schematic drawings showing the continuous amplitude-adjustable triangle wave from the amplitude-adjustable triangle-wave generator according to the first embodiment of the present invention.

In the embodiment, the pulse width modulator 100 controls the amplitude-adjustable triangle-wave generator 110 for generating small amplitude triangle waves 202 or 204 shown in FIG. 2A when the amplitude-adjustable triangle-wave generator 110 identifies that the difference between the feedback voltage and the reference voltage is higher than a transient voltage.

In the embodiment, when the amplitude-adjustable triangle-wave generator 110 identifies that the difference between the feedback voltage and the reference voltage is lower than a transient voltage or is reduced, the amplitude-adjustable triangle-wave generator 110 outputs larger amplitude triangle waves 204 or 206 than the originals shown in FIG. 2A.

In the embodiment, when the amplitude-adjustable triangle-wave generator 110 identifies that the feedback voltage is higher, or equal to, the reference voltage, the amplitude-adjustable triangle-wave generator 110 generates large triangle waves 206 or 208 as shown in FIG. 2A. In addition, the amplitude-adjustable triangle-wave generator 110 can continuously adjust the amplitude of the triangle waves 210 shown in FIG. 2B. Of course, the present invention is not limited thereto.

Figure 3:
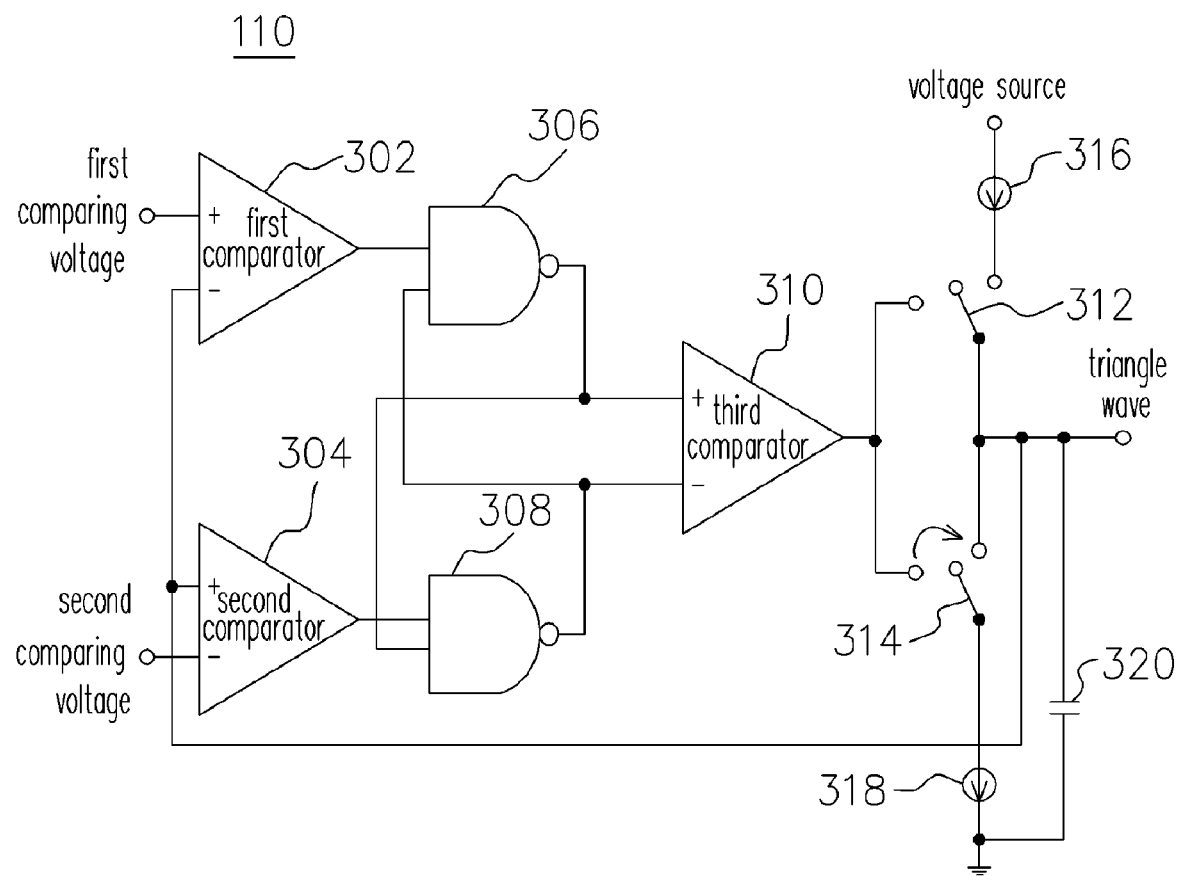
FIG. 3 is a circuit diagram showing a amplitude-adjustable triangle-wave generator according to a preferred embodiment of the present invention.

FIG. 3 is a circuit diagram showing a preferred amplitude-adjustable triangle-wave generator of the present invention. In the embodiment, the amplitude-adjustable triangle-wave generator 100 is illustrated. The present invention, however, is not limited thereto. The amplitude-adjustable triangle-wave generator 110 comprises a first comparator 302, a second comparator 304, NAND gates 306 and 308, a third comparator 310, switches 312 and 314, a charging current source 316, a discharging current source 318 and a capacitor 320.

In the embodiment, when it is in a charging status, the third comparator 310 turns off the switch 312 for charging the capacitor 320 by the charging current source 316. The amplitude of the triangle wave from the amplitude-adjustable triangle-wave generator 110 increases. When the amplitude of the triangle wave is higher than a first comparing voltage VH, the output voltage of the first comparator 302 is down to a voltage representing "0" state. The output voltage of the NAND gate 306 rises to a voltage representing "1" state. Because the amplitude of the triangle wave is higher than a second comparing voltage VL during the charging process, the output voltage of the second comparator 304 is kept at "1" state. Because the two inputs of the NAND gate 308, the output of the NAND gate 306 and the output of the second comparator 304 are all in "1" state, the output of the NAND gate 308 will be "0" state. Therefore, the positive terminal of the third comparator 310 has a higher state than that of the negative terminal thereof. The output terminal of the third comparator 310 rises to "1" state for turning on the switch 312 and terminating the charging of the capacitor 320 from the charging source 316. The charging is complete.

In the embodiment, when it is in a discharging status, the third comparator 310 turns off the switch 314 for discharging the capacitor 320 by the discharging source 318. The amplitude of the triangle wave from the amplitude-adjustable triangle-wave generator 110 decays. When the amplitude of the triangle wave is lower than the second comparing voltage VL, the output voltage of the second comparator 304 is down to a voltage representing a "0" state. The output voltage of the NAND gate 308 rises to a voltage representing "1" state. Because the amplitude of the triangle wave is higher than the first comparing voltage VH during the discharging process, the output voltage of the second comparator 304 is kept at "1" state. Because the two inputs of the NAND gate 306, the output of the NAND gate 308 and the output of the first comparator 302 are all in "1" state, the output of the NAND gate 306 will be "0" state. Therefore, the positive terminal of the third comparator 310 has a lower state than that of the negative terminal thereof. The output terminal of the third comparator 310 is down to "0" state for turning on the switch 314 and terminating the charging of the capacitor 320 from the discharging terminal 318. The discharging is complete.

In the embodiment, when the difference between the feedback voltage and the reference voltage is large, the currents for charging and discharging form the charging terminal 316 and the discharging terminal 318 are small. If it is a maximum difference, the current is a smallest one. The first comparing voltage VH of the first comparator 302 is a small voltage. The difference voltage between the first comparing voltage VH and the second comparing voltage VL is small, too. Then, the amplitude-adjustable triangle-wave generator 110 generates a small amplitude triangle wave.

In the embodiment, when the difference between the feedback voltage and the reference voltage is reduced, the currents for charging and discharging from the charging terminal 316 and the discharging terminal 318 are increased. The first comparing voltage VH of the first comparator 302 is also enhanced. Then, the amplitude-adjustable triangle-wave generator 110 generates a progressive amplitude triangle wave.

In the embodiment, when the feedback voltage is close to the reference voltage, the currents for charging and discharging from the charging terminal 316 and the discharging terminal 318 reach to the maximum. The first comparing voltage VH of the first comparator 302 also reaches a maximum. Then, the amplitude-adjustable triangle-wave generator 110 generates a maximum amplitude triangle wave.

Figure 4A:
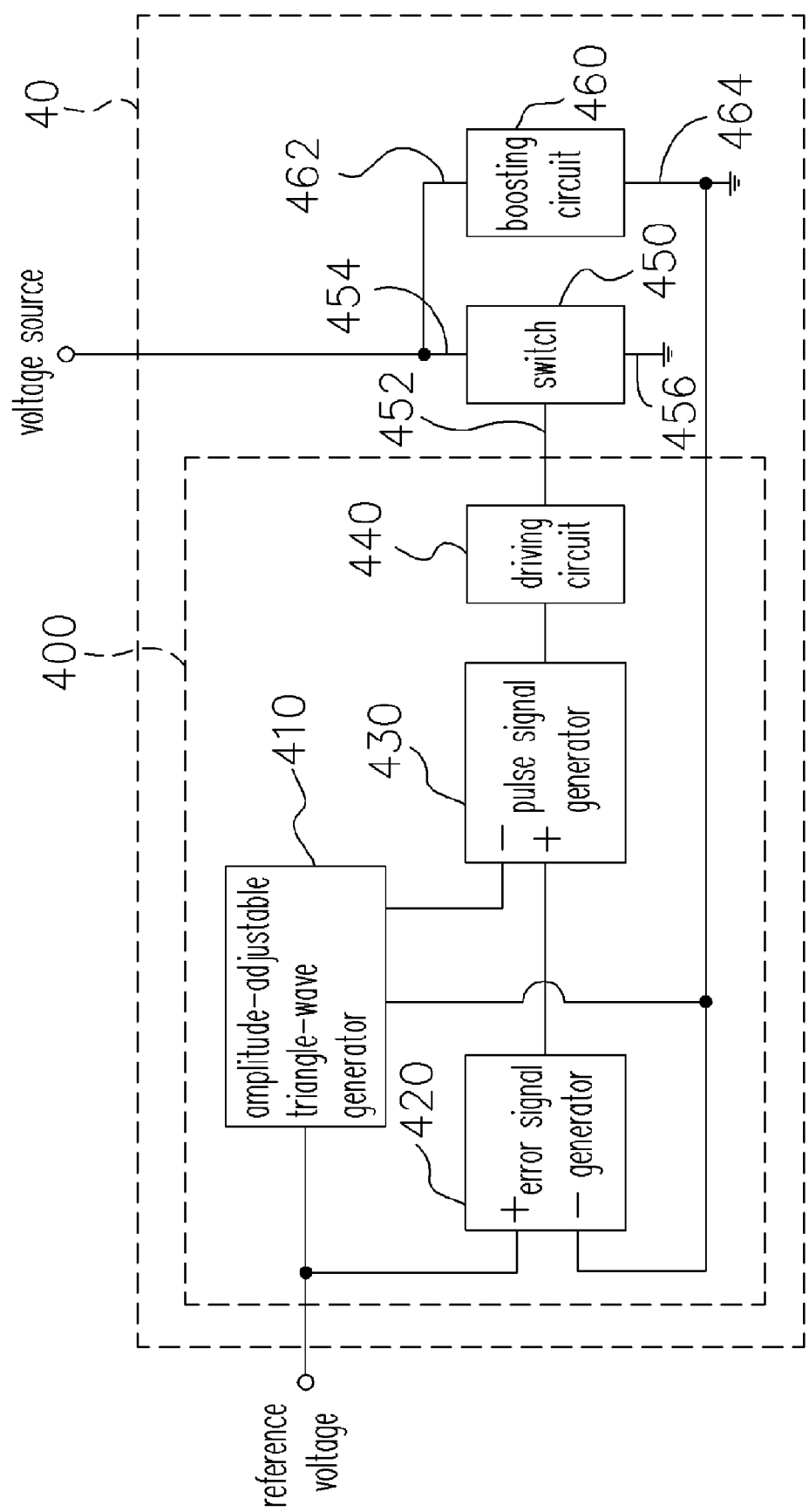
FIG. 4A is a circuit diagram showing a boosting circuit applying an amplitude-adjustable triangle-wave generator according to a preferred embodiment of the present invention.

FIG. 4A is a circuit diagram showing a boosting circuit applying an amplitude-adjustable triangle-wave generator according to a preferred embodiment of the present invention. In the embodiment, the loading system 40 is coupled to a power terminal, comprising a pulse width modulator 400, a switch 450 and the boosting circuit 460.

In the embodiment, the boosting circuit 460 has an input terminal 462 coupled to the power terminal for selectively receiving an operational voltage therefrom, and an output terminal 464. The pulse width modulator is coupled to the output terminal 464 of the boosting circuit 460, comprising: an amplitude-adjustable triangle-wave generator 410, an error signal generator 420, a pulse signal generator 430 and a driving circuit 440. The switch 450 has a first terminal 452 coupled to the driving circuit 440, a second terminal 454 coupled to the power terminal, and a third terminal 456 coupled to a ground terminal for controlling the switch 450 according to the driving signal.

The amplitude-adjustable triangle-wave generator 410 is adapted to receive a feedback voltage from the boosting circuit 460 and to perform an amplitude operation according to a reference voltage and the feedback voltage for generating an amplitude-adjustable triangle wave according to a variation of the feedback voltage. The error signal generator 420 is adapted to perform an error operation according to the feedback voltage and the reference voltage for outputting an error signal. The pulse signal generator 430 is coupled to the amplitude-adjustable triangle-wave generator 410 and the error signal generator 420, and adapted to receive and compare the error signal and the amplitude-adjustable triangle wave for outputting a pulse controlling signal. The driving circuit 440 is coupled to the pulse signal generator and adapted to receive and transform the pulse generating signal for outputting a driving signal to the switch 450.

In the embodiment, when the switch 450 is turned off, the power terminal applies the operational voltage to the boosting circuit 460; when the switch 450 is turned on, the power terminal does not apply the operational voltage to the boosting circuit 460. The amplitude-adjustable triangle-wave generator 410 is adapted to perform an amplitude operation according to the reference voltage and the feedback voltage from the output terminal 464 of the boosting circuit 460.

When the difference of the feedback voltage and the reference voltage is higher than the transient voltage, the boosting circuit is turned on. The amplitude-adjustable triangle-wave generator 410 outputs a first amplitude of the amplitude-adjustable triangle wave.

When the difference between the feedback voltage and the reference voltage is lower than the transient voltage, the amplitude-adjustable triangle-wave generator 410 outputs a progressive second amplitude of the amplitude-adjustable triangle wave.

When the feedback voltage is higher than, or equal to, the reference voltage, the boosting circuit 460 is in a stable state. The amplitude-adjustable triangle-wave generator 410 outputs a third amplitude of the amplitude-adjustable triangle wave.

Figure 4B:
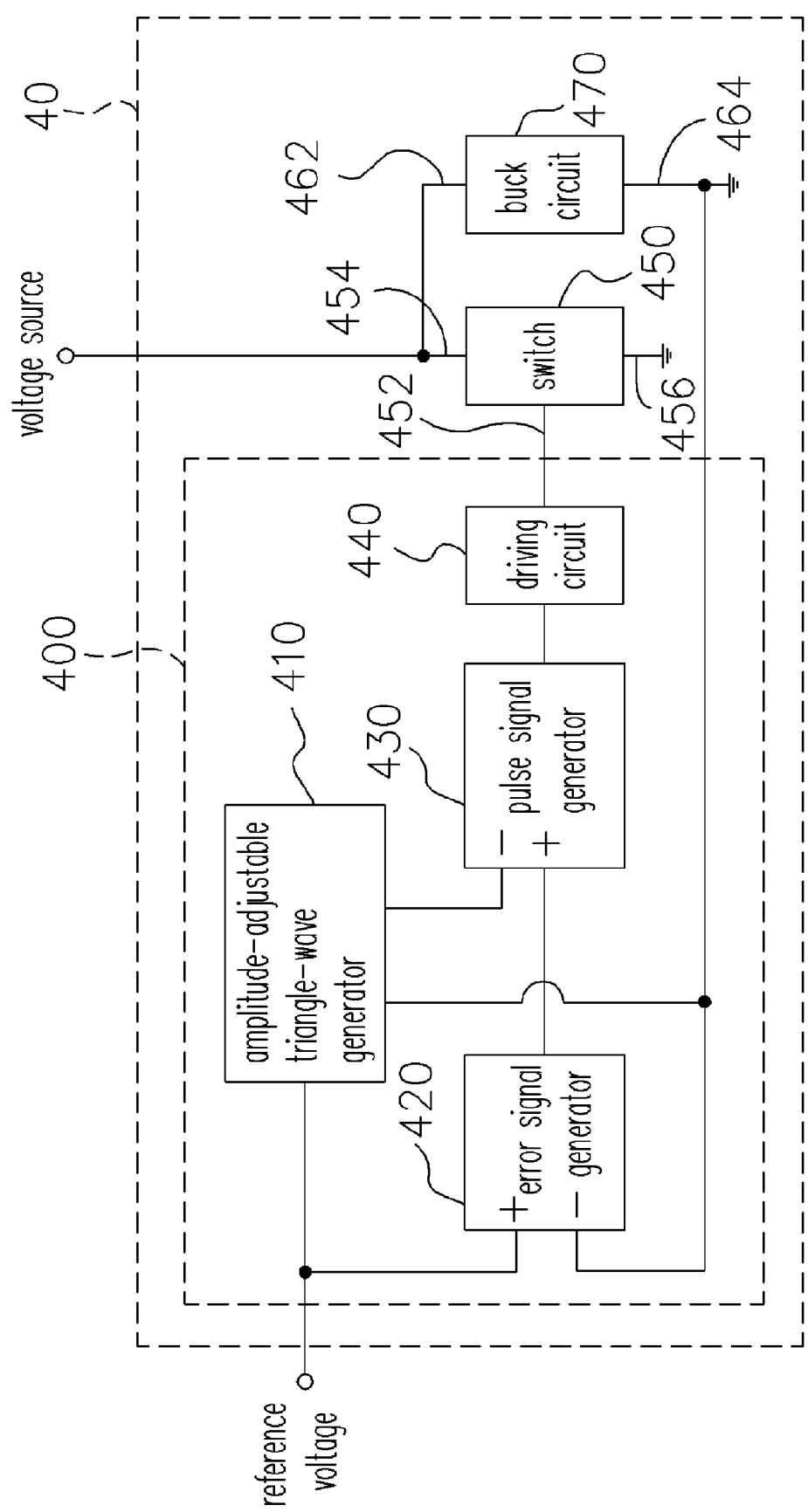
FIG. 4B is a circuit diagram showing a buck circuit applying an amplitude-adjustable triangle-wave generator according to a preferred embodiment of the present invention.

FIG. 4B is a circuit diagram showing a preferred buck circuit applying an amplitude-adjustable triangle-wave generator of the present invention. Compared with FIG. 4A, the embodiment substitutes the buck circuit 470 for the boosting circuit 460. The structure and the operation of FIG. 4B are similar to those of FIG. 4A.

Figure 4C:
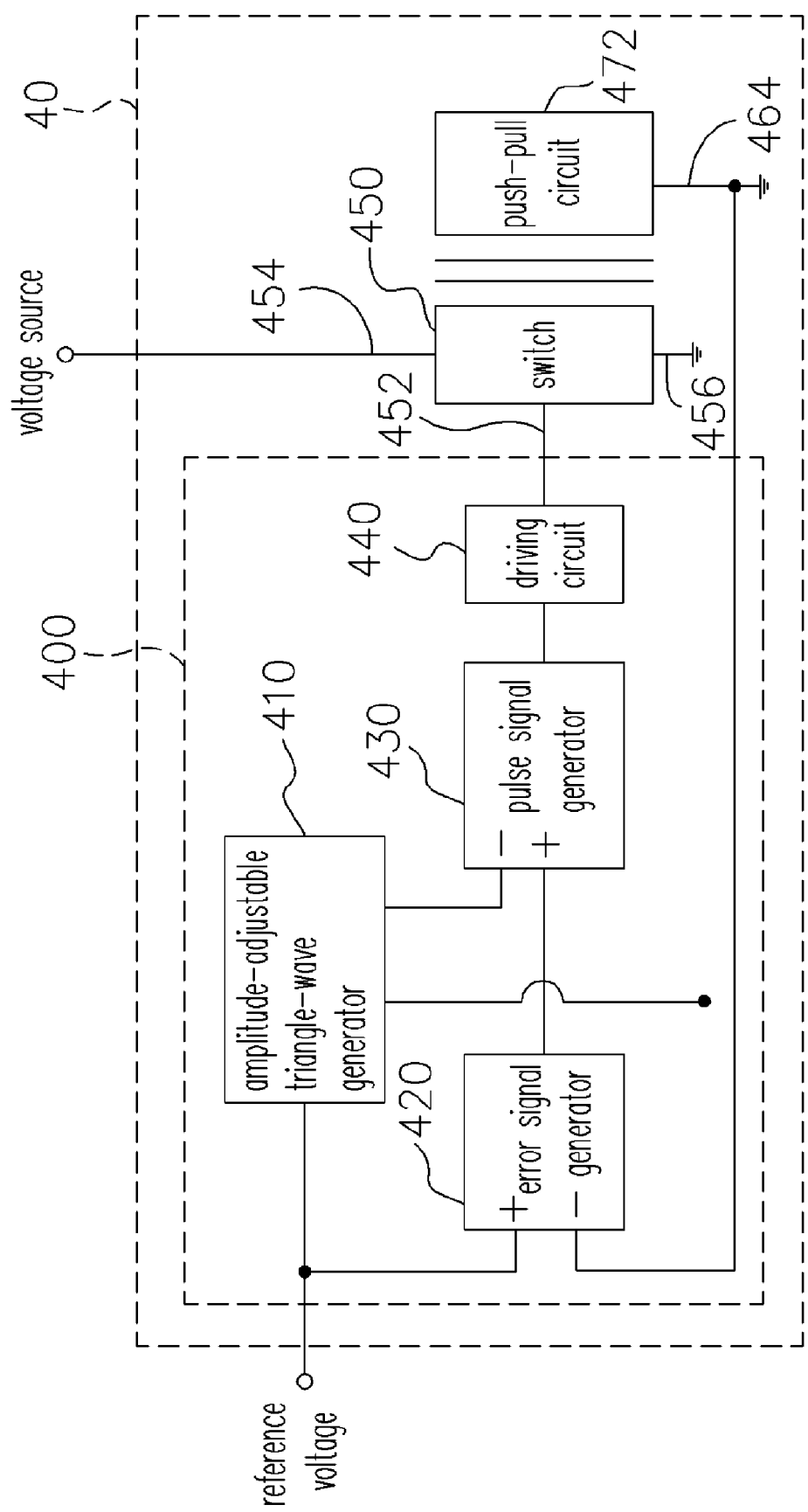
FIG. 4C is a circuit diagram showing a push-pull circuit applying an amplitude-adjustable triangle-wave generator according to a preferred embodiment of the present invention.

FIG. 4C is a circuit diagram showing a push-pull circuit applying an amplitude-adjustable triangle-wave generator according to a preferred embodiment of the present invention. Compared with FIG. 4A, the push-pull circuit is not coupled to the power terminal. It generates induced current when the switch 450 is turned on. The operation of the pulse width modulator 400 of the embodiment is similar to that of FIG. 4A.

Figure 4D:
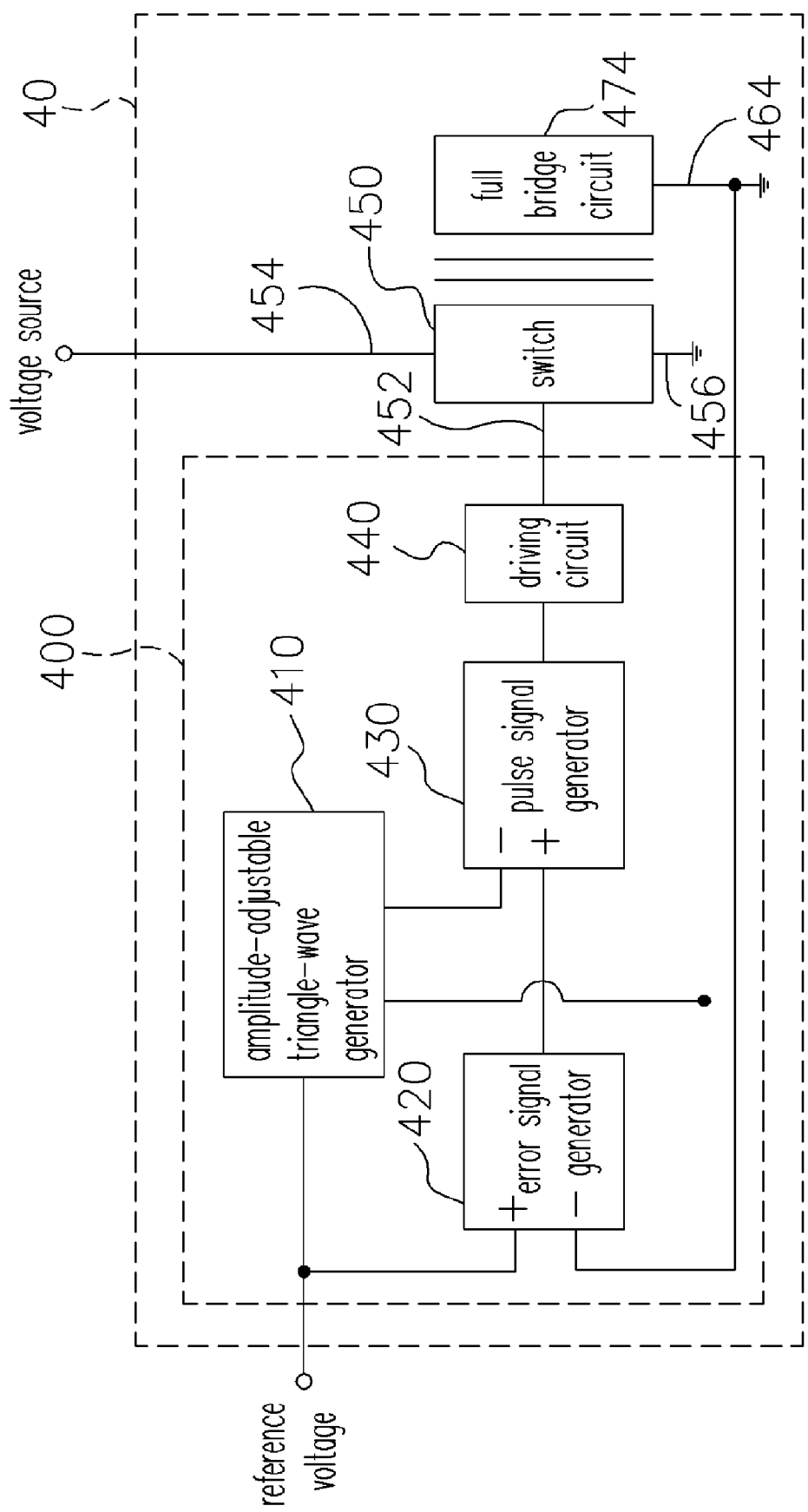
FIG. 4D is a circuit diagram showing a full-bridge circuit applying an amplitude-adjustable triangle-wave generator according to a preferred embodiment of the present invention.
Figure 4E:
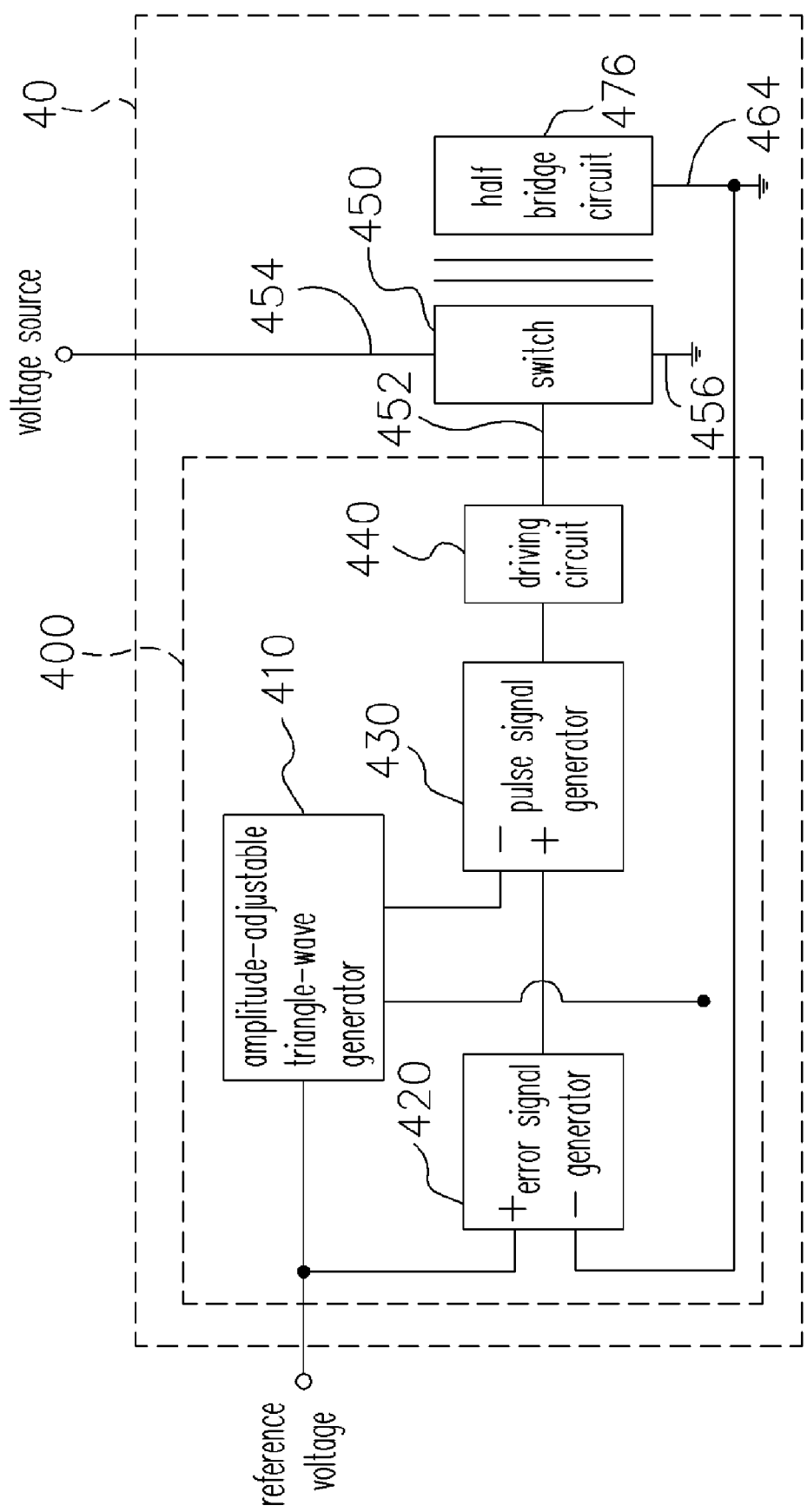
FIG. 4E is a circuit diagram showing a half-bridge circuit applying an amplitude-adjustable triangle-wave generator according to a preferred embodiment of the present invention.
Figure 5:
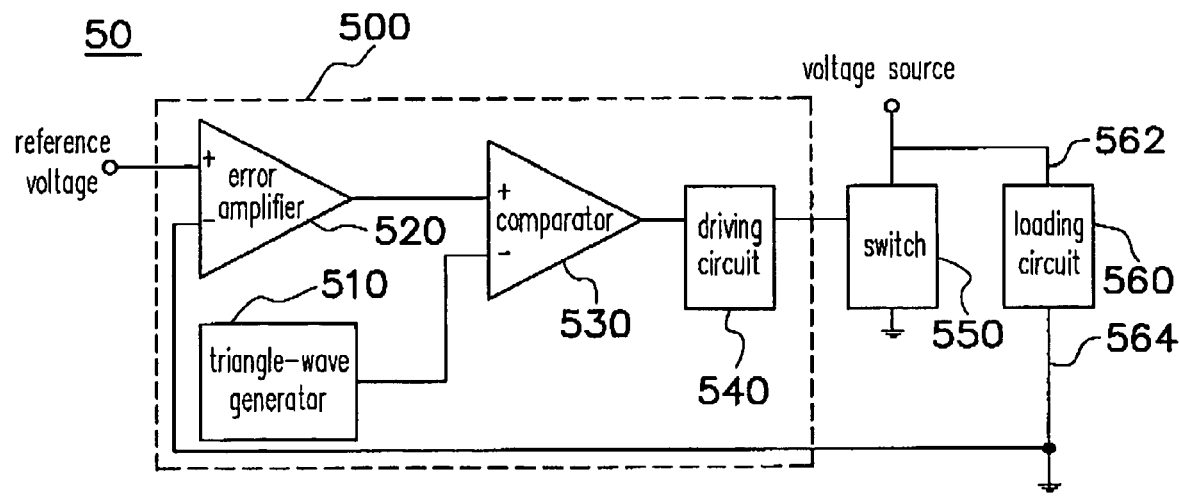
FIG. 5 is a block circuit diagram showing a conventional pulse width modulator of a loading system.
Figure 6:
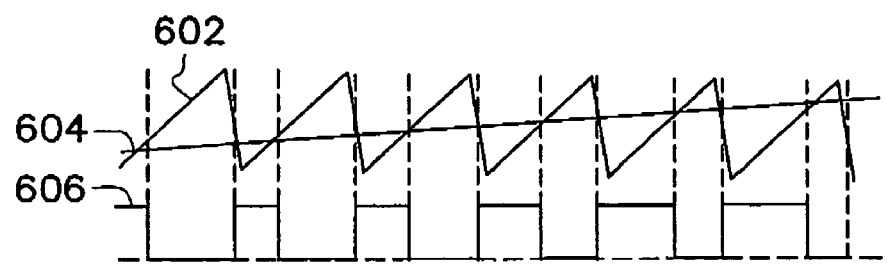
FIG. 6 is a schematic drawing showing a conventional triangle-wave generator outputting the triangle wave, the error signal and the pulse controlling signal.

FIG. 4D is a circuit diagram showing a full-bridge circuit applying an amplitude-adjustable triangle-wave generator according to a preferred embodiment of the present invention. FIG. 4E is a circuit diagram showing a half-bridge circuit applying an amplitude-adjustable triangle-wave generator according to a preferred embodiment of the present invention.

Compared with FIG. 4C, the embodiment of FIG. 4D substitutes the full-bridge circuit 474 for the push-pull circuit 472 and has the operation similar to that of FIG. 4C.

Compared with FIG. 4C, the embodiment of FIG. 4E substitutes the half-bridge circuit 476 for the push-pull circuit 472 and has the operation similar to that of FIG. 4C.

In the embodiments of the present invention, the loading circuit does not necessarily go through the original state, transient state and the stable state. It illustrates some possible situations, but not limited thereto.

In a preferred embodiment of the present invention, the error signal generator 120 can be, for example, an error integrator.

In a preferred embodiment of the present invention, the pulse signal generator 130 can be, for example, a comparator.

In a preferred embodiment of the present invention, the transient state varies depending on the design of the loading circuit 150.

In a preferred embodiment of the present invention, the reference voltage can be generated from a reference voltage generator (not show) depending on the design of the circuit.

In a preferred embodiment of the present invention, the loading system can be, for example, a front-end circuit or a fly-back circuit applying the amplitude-adjustable triangle-wave generator, but not limited thereto.

Accordingly, the pulse width modulator and the loading system thereof have following advantages.

(1) The pulse width modulator and the loading system thereof of the present invention use error integrator, instead of the error amplifier, for preventing noise.

(2) The pulse width modulator and the loading system thereof of the present invention use the amplitude-adjustable triangle-wave generator for improving the transient response thereof.

(3) The pulse width modulator and the loading system thereof of the present invention have a desired stability according to the timing factors for setting the transient response.

(4) The pulse width modulator and the loading system thereof of the present invention can substantially prevent the response of the loading system over the target.

(5) The pulse width modulator and the loading system thereof of the present invention can reduce the responsive time thereof.

(6) The pulse width modulator and the loading system thereof of the present invention can be integrated in a chip.

Although the present invention has been described in terms of exemplary embodiments, it is not limited thereto. Rather, the appended claims should be constructed broadly to include other variants and embodiments of the invention, which may be made by those skilled in the field of this art without departing from the scope and range of equivalents of the invention.

The invention claimed is:

1. A pulse width modulator, adapted to receive a feedback voltage and a reference voltage, the pulse width modulator comprising:
   an amplitude-adjustable triangle-wave generator, adapted to perform an amplitude operation according to the reference voltage and the feedback voltage for generating an amplitude-adjustable triangle wave according to a variation of the feedback voltage;
   an error signal generator, adapted to perform an error operation according to the feedback voltage and the reference voltage for outputting an error signal;
   a pulse signal generator, coupled to the amplitude-adjustable triangle-wave generator and the error signal generator, adapted to receive and compare the error signal and the amplitude-adjustable triangle wave for outputting a pulse controlling signal; and
   a driving circuit, coupled to the pulse signal generator, adapted to receive and transform the pulse generating signal for outputting a driving signal.

2. The pulse width modulator of claim 1, wherein when a difference between the feedback voltage and the reference voltage is higher than a transient voltage, the amplitude-adjustable triangle-wave generator outputs a first amplitude of the amplitude-adjustable triangle wave.

3. The pulse width modulator of claim 1, wherein when a difference between the feedback voltage and the reference voltage is lower than a transient voltage, the amplitude-adjustable triangle-wave generator outputs a progressive second amplitude of the amplitude-adjustable triangle wave.

4. The pulse width modulator of claim 1, wherein when the feedback voltage is higher than, or equal to, the reference voltage, the amplitude-adjustable triangle-wave generator outputs a third amplitude of the amplitude-adjustable triangle wave.

5. A loading system, coupled to a power terminal, the loading system comprising:
   a boosting circuit having an input terminal, coupled to the power terminal for selectively receiving an operational voltage therefrom, and an output terminal;
   a pulse width modulator, coupled to the output terminal of the boosting circuit, comprising:
      an amplitude-adjustable triangle-wave generator, adapted to receive a feedback voltage from the boosting circuit and to perform an amplitude operation according to a reference voltage and the feedback voltage for generating an amplitude-adjustable triangle wave according to a variation of the feedback voltage;
      an error signal generator, adapted to perform an error operation according to the feedback voltage and the reference voltage for outputting an error signal;
      a pulse signal generator, coupled to the amplitude-adjustable triangle-wave generator and the error signal generator, adapted to receive and compare the error signal and the amplitude-adjustable triangle wave for outputting a pulse controlling signal;
      a driving circuit, coupled to the pulse signal generator, adapted to receive and transform the pulse generating signal for outputting a driving signal; and
   a switch having a first terminal, coupled to the driving circuit, a second terminal coupled to the power terminal, and a third terminal coupled to a ground terminal, the turning on or turning off of the switch depends on the driving signal.

6. The loading system of claim 5, wherein when the switch is turned off, the power terminal applies the operational voltage to the boosting circuit; when the switch is turned on, the power terminal does not apply the operational voltage to the boosting circuit.

7. The loading system of claim 5, wherein when a difference between the feedback voltage and the reference voltage is higher than a transient voltage, the amplitude-adjustable triangle-wave generator outputs a first amplitude of the amplitude-adjustable triangle wave.

8. The loading system of claim 5, wherein when a difference between the feedback voltage and the reference voltage is lower than a transient voltage, the amplitude-adjustable triangle-wave generator outputs a progressive second amplitude of the amplitude-adjustable triangle wave.

9. The loading system of claim 5, wherein when the feedback voltage is higher than, or equal to, the reference voltage, the amplitude-adjustable triangle-wave generator outputs a third amplitude of the amplitude-adjustable triangle wave.

10. A loading system, coupled to a power terminal, the loading system comprising:
   a buck circuit, having an input terminal coupled to the power terminal for selectively receiving an operational voltage therefrom, and an output terminal;
   a pulse width modulator, coupled to the output terminal of the buck circuit, comprising:
      an amplitude-adjustable triangle-wave generator, adapted to receive a feedback voltage from the buck circuit and to perform an amplitude operation according to a reference voltage and the feedback voltage for generating an amplitude-adjustable triangle wave according to a variation of the feedback voltage;
      an error signal generator, adapted to perform an error operation according to the feedback voltage and the reference voltage for outputting an error signal;
      a pulse signal generator, coupled to the amplitude-adjustable triangle-wave generator and the error signal generator, adapted to receive and compare the error signal and the amplitude-adjustable triangle wave for outputting a pulse controlling signal;
      a driving circuit, coupled to the pulse signal generator, adapted to receive and transform the pulse generating signal for outputting a driving signal; and
   a switch, having a first terminal coupled to the driving circuit, a second terminal coupled to the power terminal, and a third terminal coupled to a ground terminal, the turning on or turning off of the switch depends on the driving signal.

11. The loading system of claim 10, wherein when the switch is turned off, the power terminal applies the operational voltage to the boosting buck circuit; when the switch is turned on, the power terminal does not apply the operational voltage to the boosting buck circuit.

12. The loading system of claim 10, wherein when a difference between the feedback voltage and the reference voltage is higher than a transient voltage, the amplitude-adjustable triangle-wave generator outputs a first amplitude of the amplitude-adjustable triangle wave.

13. The loading system of claim 10, wherein when a difference between the feedback voltage and the reference voltage is lower than a transient voltage, the amplitude-adjustable triangle-wave generator outputs a progressive second amplitude of the amplitude-adjustable triangle wave.

14. The loading system of claim 10, wherein when the feedback voltage is higher than, or equal to, the reference voltage, the amplitude-adjustable triangle-wave generator outputs a third amplitude of the amplitude-adjustable triangle wave.

15. A loading system coupled to a power terminal, the loading system comprising:
   a push-pull circuit, having an input and an output terminal, the output terminal outputting a feedback voltage;
   a pulse width modulator, coupled to the output terminal of the push-pull circuit, comprising:
      an amplitude-adjustable triangle-wave generator, adapted to receive the feedback voltage from the push-pull circuit and to perform an amplitude operation according to a reference voltage and the feedback voltage for generating an amplitude-adjustable triangle wave according to a variation of the feedback voltage;
      an error signal generator, adapted to perform an error operation according to the feedback voltage and the reference voltage for outputting an error signal;
      a pulse signal generator, coupled to the amplitude-adjustable triangle-wave generator and the error signal generator, adapted to receive and compare the error signal and the amplitude-adjustable triangle wave for outputting a pulse controlling signal;
      a driving circuit, coupled to the pulse signal generator, adapted to receive and transform the pulse generating signal for outputting a driving signal; and
   a switch, having a first terminal coupled to the driving circuit, a second terminal coupled to the power terminal, and a third terminal coupled to a ground terminal, the turning on or turning off of the switch depends on the driving signal.

16. The loading system of claim 15, wherein the push-pull circuit generates an induced current when the switch is turned on.

17. The loading system of claim 15, wherein when a difference between the feedback voltage and the reference voltage is higher than a transient voltage, the amplitude-adjustable triangle-wave generator outputs a first amplitude of the amplitude-adjustable triangle wave.

18. The loading system of claim 15, wherein when a difference between the feedback voltage and the reference voltage is lower than a transient voltage, the amplitude-adjustable triangle-wave generator outputs a progressive second amplitude of the amplitude-adjustable triangle wave.

19. The loading system of claim 15, wherein when the feedback voltage is higher than, or equal to, the reference voltage, the amplitude-adjustable triangle-wave generator outputs a third amplitude of the amplitude-adjustable triangle wave.

20. A loading system coupled to a power terminal, the loading system comprising:
   a full-bridge circuit, having an input and an output terminal, the output terminal outputting a feedback voltage;
   a pulse width modulator, coupled to the output terminal of the full-bridge circuit, comprising:
      an amplitude-adjustable triangle-wave generator, adapted to receive the feedback voltage from the full-bridge circuit and to perform an amplitude operation according to a reference voltage and the feedback voltage for generating an amplitude-adjustable triangle wave according to a variation of the feedback voltage;
      an error signal generator, adapted to perform an error operation according to the feedback voltage and the reference voltage for outputting an error signal;
      a pulse signal generator, coupled to the amplitude-adjustable triangle-wave generator and the error signal generator, adapted to receive and compare the error signal and the amplitude-adjustable triangle wave for outputting a pulse controlling signal;
      a driving circuit, coupled to the pulse signal generator, adapted to receive and transform the pulse generating signal for outputting a driving signal; and
   a switch, having a first terminal coupled to the driving circuit, a second terminal coupled to the power terminal, and a third terminal coupled to a ground terminal, the turning on or turning off of the switch depends on the driving signal.

21. The loading system of claim 20, wherein the full-bridge circuit generates an induced current when the switch is turned on.

22. The loading system of claim 20, wherein when a difference between the feedback voltage and the reference voltage is higher than a transient voltage, the amplitude-adjustable triangle-wave generator outputs a first amplitude of the amplitude-adjustable triangle wave.

23. The loading system of claim 20, wherein when a difference between the feedback voltage and the reference voltage is lower than a transient voltage, the amplitude-adjustable triangle-wave generator outputs a progressive second amplitude of the amplitude-adjustable triangle wave.

24. The loading system of claim 20, wherein when the feedback voltage is higher than, or equal to, the reference voltage, the amplitude-adjustable triangle-wave generator outputs a third amplitude of the amplitude-adjustable triangle wave.

25. A loading system coupled to a power terminal, the loading system comprising:
   a half-bridge circuit, having an input and an output terminal, the output terminal outputting a feedback voltage;
   a pulse width modulator, coupled to the output terminal of the half-bridge circuit, comprising:
      an amplitude-adjustable triangle-wave generator, adapted to receive the feedback voltage from the half-bridge circuit and to perform an amplitude operation according to a reference voltage and the feedback voltage for generating an amplitude-adjustable triangle wave according to a variation of the feedback voltage;
      an error signal generator, adapted to perform an error operation according to the feedback voltage and the reference voltage for outputting an error signal;
      a pulse signal generator, coupled to the amplitude-adjustable triangle-wave generator and the error signal generator, adapted to receive and compare the error signal and the amplitude-adjustable triangle wave for outputting a pulse controlling signal;
   a driving circuit, coupled to the pulse signal generator, adapted to receive and transform the pulse generating signal for outputting a driving signal; and
   a switch, having a first terminal coupled to the driving circuit, a second terminal coupled to the power terminal, and a third terminal coupled to a ground terminal, the turning on or turning off of the switch depends on the driving signal.

26. The loading system of claim 25, wherein the full-bridge circuit generates an induced current when the switch is turned on.

27. The loading system of claim 25, wherein when a difference between the feedback voltage and the reference voltage is higher than a transient voltage, the amplitude-adjustable triangle-wave generator outputs a first amplitude of the amplitude-adjustable triangle wave.

28. The loading system of claim 25, wherein when a difference between the feedback voltage and the reference voltage is lower than a transient voltage, the amplitude-adjustable triangle-wave generator outputs a progressive second amplitude of the amplitude-adjustable triangle wave.

29. The loading system of claim 25, wherein when the feedback voltage is higher than, or equal to, the reference voltage, the amplitude-adjustable triangle-wave generator outputs a third amplitude of the amplitude-adjustable triangle wave.

* * * * *